United States Patent [19]
Buckley, III et al.

[11] 3,986,041
[45] Oct. 12, 1976

[54] CMOS DIGITAL CIRCUITS WITH RESISTIVE SHUNT FEEDBACK AMPLIFIER

[75] Inventors: Frederick Buckley, III, Vestal; Malcom Kenneth Creamer, Jr., Endicott; Gerald Aberdeen Miller, Owego, all of N.Y.

[73] Assignee: International Business Machines Corporation, Armonk, N.Y.

[22] Filed: Dec. 20, 1974

[21] Appl. No.: 534,950

[52] U.S. Cl. .............................. 307/205; 307/215; 307/216; 307/218; 307/304; 330/35
[51] Int. Cl.² ................. H03K 19/08; H03K 19/32; H03K 19/34; H03K 19/36
[58] Field of Search ........... 307/205, 214, 215, 216, 307/218, 304; 330/35

[56] References Cited
UNITED STATES PATENTS

| | | | |
|---|---|---|---|
| 3,033,995 | 5/1962 | Putzrath | 307/216 |
| 3,252,011 | 5/1966 | Zuk | 307/216 X |
| 3,392,341 | 7/1968 | Burns | 307/304 X |
| 3,413,488 | 11/1968 | Yee | 307/216 |
| 3,497,715 | 2/1970 | Yen | 307/205 |
| 3,500,062 | 3/1970 | Annis | 307/304 X |
| 3,737,673 | 6/1973 | Suzuki | 307/214 X |
| 3,829,710 | 8/1974 | Hirasawa et al. | 307/205 |
| 3,855,549 | 12/1974 | Heuner et al. | 307/205 X |
| 3,886,464 | 5/1975 | Dingwall | 330/35 X |

OTHER PUBLICATIONS

Ho et al., "Static Shift Register for FET Technology," IBM Tech. Discl. Bull.; vol. 13, No. 6, pp. 1450–1451; 11/1970.

*Primary Examiner*—John S. Heyman
*Assistant Examiner*—L. N. Anagnos
*Attorney, Agent, or Firm*—John E. Hoel

[57] ABSTRACT

A negative shunt feedback amplifier is disclosed for connection to the output node of a complex complementary metal oxide semiconductor logic circuit to increase the performance and reduce the FET device size. A CMOS inverter is coupled to the amplifier to restore the logic levels and to form the logic output. A first embodiment of the invention uses a resistor feedback and a second embodiment of the invention uses parallel N-channel and P-channel FETs to form the feedback impedance. The circuit has application in environments where a logic function requires a large number of FET devices resulting in a large output node capacitance and, thereby slowing the logic speed, as for example in a large DOT-OR circuit or at each output of a FET memory array.

18 Claims, 23 Drawing Figures

FIG. 1

RESISTOR SHUNT
CMOS AMPLIFIER

FIG. 2

ACTIVE SHUNT
CMOS AMPLIFIER

FIG. 3a

T$_2$ ON (SLIGHTLY) ≈ OFF
T$_1$ ON

R$_{11}$ < R$_{21}$ < R$_{31}$ < R$_{41}$ < R$_{51}$
R$_{12}$ < R$_{22}$ < R$_{32}$ < R$_{42}$ < R$_{52}$

T$_2$ ON
TRANSFER CHARACTERISTIC   T$_1$ OFF

| CURVE | $\frac{W_1}{L_1}$ | $\frac{W_2}{L_2}$ |
|---|---|---|
| 1 | R$_{11}$ | R$_{12}$ |
| 2 | R$_{21}$ | R$_{22}$ |
| 3 | R$_{31}$ | R$_{32}$ |
| 4 | R$_{41}$ | R$_{42}$ |
| 5 | R$_{51}$ | R$_{52}$ |

FIG. 3b

RESISTOR FEEDBACK

FIG. 4a

ACTIVE FEEDBACK

FIG. 4b

CONVENTIONAL

FIG. 4c

$\overline{Z} = AB + CD$

$\overline{Z} = A(BC+F) + DE(BC+F)$

FIG. 7a $\overline{Z} = A(BC+F) + DE(BC+F)$

TWO WAY EXCLUSIVE OR
$Z = \bar{A}B + A\bar{B}$

FIG. 9a

TWO WAY EXCLUSIVE OR
$Z = \bar{A}B + A\bar{B}$

CMOS DIGITAL CIRCUITS WITH RESISTIVE SHUNT FEEDBACK AMPLIFIER

FIELD OF THE INVENTION

The invention disclosed herein relates to digital logic circuitry and more specifically relates to complementary field effect transistor logic circuitry.

BACKGROUND OF THE INVENTION

A problem confronting digital integrated circuit designers today is obtaining high speed operation from a logic or memory circuit having a large capacitance in parallel with the output node. For example, large signal currents are presently required at the output node of a dot or of multiple input ANDs embodied in an FET integrated circuit, in order to charge the inherent capacitance in parallel with the node to a sufficient level to obtain a useable output voltage swing. The large signal current in turn generates substantial resistive power dissipation in the circuit, which is objectionable in high density applications. Reducing the signal current increases the signal transition times and propagation delay for the circuit. What the prior art needs is a means for extracting a relatively small signal current which appears in parallel with a large capacitance at the output node of an integrated FET logic or memory circuit, so as to transform it into a relatively large voltage signal for use in subsequent signal processing.

OBJECTS OF THE INVENTION

It is an object of the invention to rapidly extract a small signal current from a field effect transistor logic circuit having a large output capacitance, in an improved manner.

It is another object of the invention to rapidly extract a relatively small signal current from a field effect transistor memory circuit having a large output capacitance, in an improved manner.

It is still another object of the invention to rapidly extract a relatively small signal current from a complementary field effect transistor logic circuit, in an improved manner.

It is still a further object of the invention to extract a relatively small signal current from a complementary field effect transistor logic circuit having a large output capacitance, in a more rapid manner than available in the prior art.

It is still another object of the invention to implement high speed complementary field effect transistor logic circuits with fewer and smaller FET devices than has been possible in the prior art.

It is yet another object of the invention to perform logical operations in a FET digital circuit having a high output capacitance, with a greater speed than possible in the prior art.

SUMMARY OF THE INVENTION

These and other objects of the invention are accomplished by the negative shunt feedback amplifier disclosed herein which is connected to the output node of a complex CMOS logic circuit so as to increase the performance and reduce the FET device size therein. A CMOS inverter is coupled to the amplifier to restore the logic levels and to form the logic output. A first embodiment of the shunt feedback amplifier employs a resistor feedback element. A second embodiment of the shunt feedback amplifier employs a parallel array of N-channel and P-channel FET devices to form the feedback impedance.

The principle upon which the instant invention is based is the placement of the summing node of a negative feedback amplifier having a shunt feedback configuration, at the output node of a signal source which has a large capacitance in parallel. The negative shunt feedback amplifier presents the source current from the output node, with a low impedance path in the desired direction past the source capacitance and into the amplifier input.

The second embodiment of the amplifier improves the performance over that of the first embodiment because the feedback FETs require less space for layout on the chip. In addition, their non-linear voltage-current characteristics track the varying FET device gains in the logic to minimize undesirable variations in amplifier output voltage due to the non-uniform gains. This results in a reduction in worst-case delay times. The shunt feedback amplifier is employed in a number of novel FET circuits including fast DOT-OR logic, true and complement functions, exclusive OR circuits, complex logic functions, memory array configurations and fast MOS interchip receivers. A novel integrated circuit structure in which the shunt feedback amplifier is embodied, is disclosed.

DESCRIPTION OF THE DRAWINGS

The foregoing and other objects, features, and advantages of the invention will be apparent from the following more particular description of the preferred embodiment of the invention, as illustrated in the accompanying drawings.

FIG. 3b is a graph and table of the transfer characteristic of the active shunt CMOS amplifier of FIG. 3a.

DISCUSSION OF THE PREFERRED EMBODIMENT

Complementary metal oxide semiconductor (CMOS) technology employs both P-channel and N-channel devices; that is, gate voltage must be increased in the direction that inverts the surface in order for the device to conduct. An enhancement-mode device is normally turned off.

Figure 1:
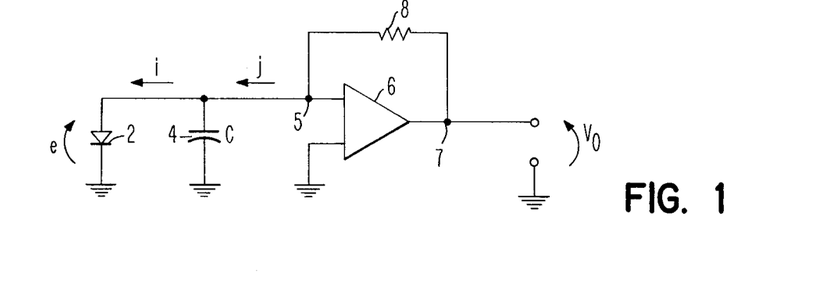
FIG. 1 is a generalized diagram of the interconnection of a shunt feedback amplifier with a signal source.

A number of situations in high performance large scale integrated circuit digital systems require the rapid extraction of a relatively small signal current i which appears in parallel with a large source capacitance C. Two common examples of this requirement are bit line receivers in memory arrays and large DOT-OR configurations in digital logic. The principle upon which the instant invention is based is the placement of the summing node 5 of a negative feedback amplifier 6 having a shunt feedback configuration, at the output node of a signal source 2 which has the large capacitance 4 in parallel, as is shown in FIG. 1. The negative shunt feedback amplifier presents the source current i with a low impedance path in the desired direction past the source capacitance 4 and into the amplifier input 5. The input impedance R at the summing node 5 can be decreased by increasing the forward gain of the amplifier 6 until instability of the negative feedback is reached for a given magnitude of the capacitance 4.

Figure 2:
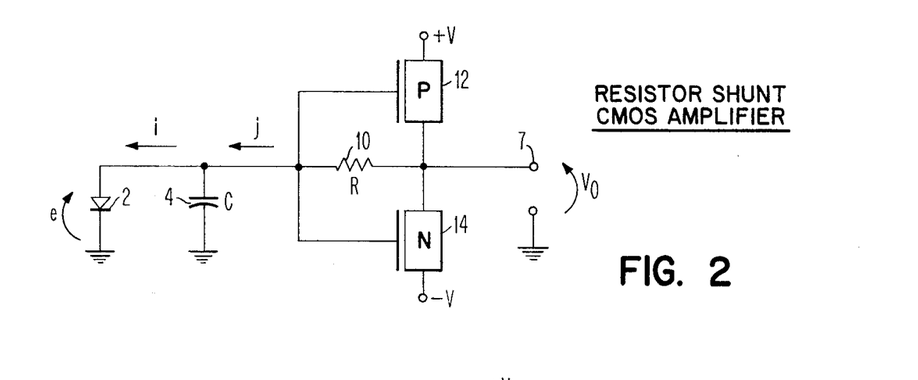
FIG. 2 is a detailed circuit diagram of the resistor shunt CMOS amplifier.

The implementation of the resistor shunt CMOS amplifier is shown in FIG. 2. The current signal source 2 and capacitance 4 serve as the input to the resistor shunt CMOS amplifier which comprises the P-channel FET 12 which is series connected to the N-channel FET 14 between the upper voltage +V and the lower voltage −V. The feedback resistor 10 having a resistance R connects the node between FET 12 and FET 14 with the input node of the amplifier. The voltage e across current signal source 2 remains substantially constant at the threshold voltage $E_T$ of the amplifier circuit formed by the devices 12 and 14 because of the negative feedback of the resistor 10. The output voltage $V_O$ is essentially $E_T$ + the current $j$ × the magnitude R of the resistor 10.

Figure 4A:
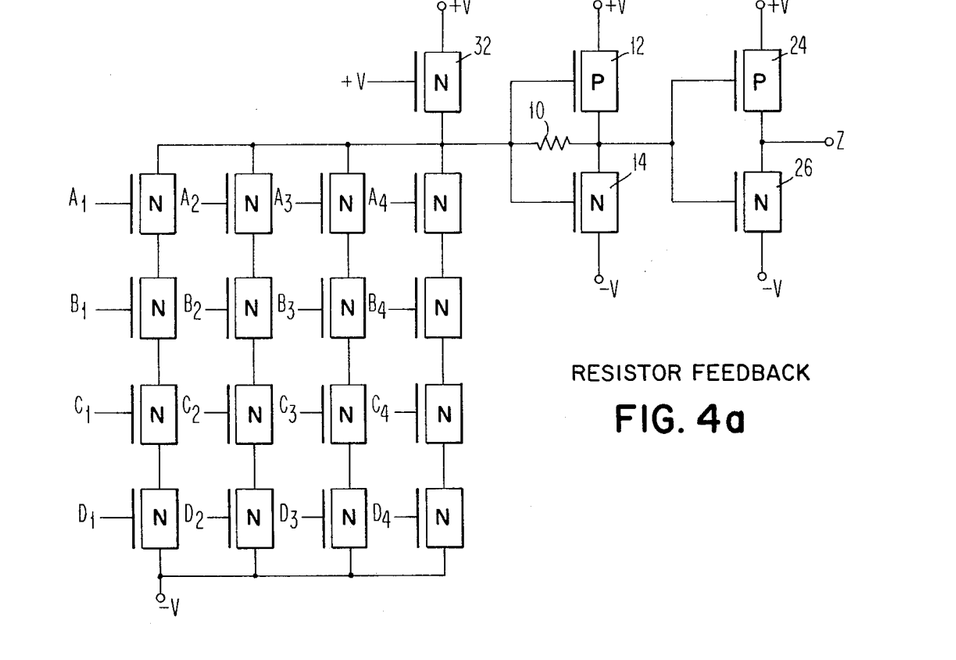
FIG. 4a is a detailed circuit diagram of the four-way DOT-OR of four-input ANDs employing the resistor shunt CMOS amplifier.

The resistor shunt CMOS amplifier is employed in a four-way DOT-OR of four-input ANDs in FIG. 4a. A N-channel FET device 32 serves as a current source which provides a constant current i equal to one-half the value of $j$ when one AND, for example, A1, B1, C1 and D1 in FIG. 4a, is satisfied. Any other current source could be used instead of device 32. If N ANDs are satisfied (if $A_i$, $B_i$, $C_i$ and $D_i$ are positive for $i = 1, \ldots, N$), the current $j=2(N)(i)$ and voltage $V_O$ at the node connecting FET 12 and FET 14 is $E_T + 2(N)(i)(R)$ where R is the resistance R of the resistor 10 and N is the number of satisfied ANDs. If $N$ equals 1, as would be the case of an input decode in an array bit line receiver, $V_O$ swings $E_T$ + or − $(i)(R)$. In large DOT-OR configurations, $j = 2(N)(i)$ which can become large enough to saturate the amplifier composed of devices 12 and 14 and resistor 10 and thus $e$ no longer remains constant. This effect can be eliminated by making the resistor 10 sharply non-linear. A simple CMOS inverter comprising P-channel FET device 24 and N-channel FET device 26 is connected to the output of the resistor shunt CMOS amplifier of FIG. 4a. The voltage swing $V_O = 2(i)(R)$ when $N = 1$ is designed to be large enough so that either the N-channel or the P-channel device is off, eliminating large currents between the +V and −V supplies. The inverter comprising FET devices 24 and 26 restores the normal voltage swing which is the difference between the higher voltage +V and the lower voltage −V. The large output node capacitance of the DOT-OR logic circuit is circumvented by the resistor shunt feedback amplifier, enabling the normal voltage swing which is the difference between the higher voltage +V and the lower voltage −V. The large output node capacitance of the DOT-OR logic circuit is circumvented by the resistor shunt feedback amplifier, enabling the performance of the logic function with a higher speed per unit power.

Some of the advantages of using the shunt CMOS amplifier at the output node of LSI logic having a large parallel capacitance are illustrated by FIG. 4a. Small signal currents within the logic net are quickly transferred to the z output of the invention. This is accomplished by a reduction in the input impedance at the output node of the logic. In addition, linear biasing eliminates the usual slewing delay when the input current begins and the node voltage slews to the threshold. In FIG. 4a, the node voltage is held very close to the threshold for both the shunt and the inverter stages in both the 1 and the 0 output states. The separation of the logic net from circuit drivers allows the logic input devices $A_1$, $B_1$, etc., to be of minimum size, resulting in as much as a ten times reduction in input capacitance at the gates of these devices and a ten times increase in the fan-out per unit performance.

A number of unique attributes arise in employing the resistor shunt CMOS amplifier when it is compared to conventional CMOS logic circuitry. FIG. 4a and FIG. 4c each perform the same logic function of a four-way DOT-OR of four-input ANDs, FIG. 4a illustrating the use of a resistor shunt CMOS amplifier and FIG. 4c illustrating the conventional circuit design. By employing the resistor shunt CMOS amplifier, the number of devices necessary to implement the logic function has been reduced by a factor of 2 when compared to the conventional circuit layout of FIG. 4c. In addition, each FET device employed in the logic function circuit of FIG. 4a is about one-tenth the size of those in the conventional circuit of FIG. 4c, thereby saving much space and decreasing circuit input capacitance. Thus, the fan-out and power supply current transients per unit power are decreased by more than a factor of 10. In addition, the complex and space consuming wiring between complementary gates within one conventional four-way NAND and between NANDs in FIG. 4c is eliminated entirely. The circuits in FIG. 4a and FIG. 4c have substantially the same circuit delay in the four-way OR of four-input ANDs shown. Analysis shows that an expansion of the logic function implemented in FIG. 4a to an 8 or to a 16-way DOT-OR increases the delay by only 20 percent and 35 percent, respectively, with no increase in circuit power dissipation. The worst-case recovery time from saturation increases from 1.5 × the circuit delay for a four-way OR to 2.0 × the circuit delay for a 16 way OR. An expansion of the conventional circuit layout of FIG. 4c to a comparable sixteen-way OR of four-way ANDs would more than quadruple the power dissipation, ΔI and noise generation while increasing the delay by 50 percent.

Figure 3A:
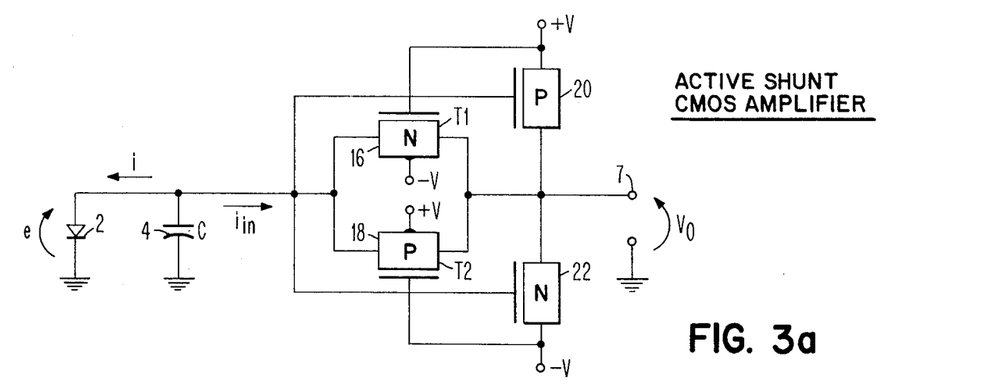
FIG. 3a is a detailed circuit diagram of the active shunt CMOS amplifier.

An alternate embodiment of the invention is the active shunt CMOS amplifier shown in FIG. 3a. The signal source 2 and parallel capacitance 4 are connected to the input node 5 of the active shunt CMOS amplifier which is composed of FET devices 16, 18, 20 and 22. P-channel FET device 20 is series connected with the N-channel FET device 22 between the relatively high potential +V and the relatively lower potential −V with the common node serving as the output 7. The T1 FET device 16 is an N-channel and the T2 FET device 18 is a P-channel which are mutually connected in parallel between the output node 7 and the input node 5 of the active shunt CMOS amplifier. T1 and T2 are biased as load devices so as to form an active shunt feedback for the amplifier. T1 has its substrate biased at a relatively low potential and T2 has its substrate biased at a relatively high potential. The transfer characteristics shown in FIG. 3b completely describe the circuit operation for the active shunt CMOS amplifier of FIG. 3a. The circuit transfer characteristic can be customized to satisfy any input current $i_{IN}$ and output voltage $V_O$ requirements as shown by the table and family of curves in FIG. 3b. If the input current $i_{IN}$ for example, were + or − 0.2 milliamps and the desired output was + or − 2 volts, curve number 3 would be chosen and the width to length ratio of T1 and T2 obtained from the table shown in FIG. 3b. If the input current were + 0.2 to − 0.1 milliamps and a voltage swing of + or − 2 volts is still required, curve number 1 in quadrant 2 and curve number 3 in quadrant 4 of the transfer characteristics shown in FIG. 3b, would satisfy this condition. Therefore, $W1/L1 = R_{31}$ for T1 and $W2/L2 = R_{12}$ for T2.

Figure 3B:
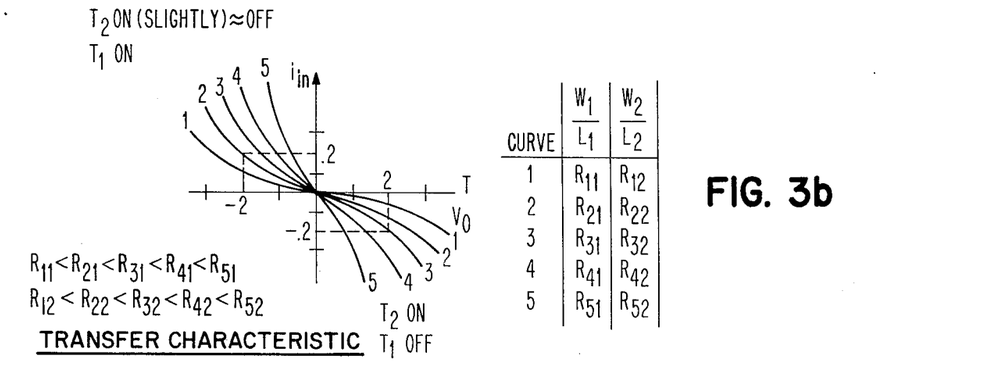

For a given width-to-length (W/L) ratio for $T_1$, $T_2$, the transfer characteristic for FIG. 3b can be generated by applying various input currents to node 5 of FIG. 3a, and observing the output voltage of node 22. The entire family of curves can be generated by repeating the above for various W/L ratios for $T_1$ and $T_2$. $R_{11}$, $R_{21}$, $R_{31}$, $R_{41}$, and $R_{51}$ refer to W/L ratios for $T_1$, each greater than the last (e.g. $R_{51} > R_{41}$, etc). Similarly $R_{12}$, $R_{22}$, $R_{32}$, $R_{42}$ and $R_{52}$ refer to W/L ratios for $T_2$, each greater than the last (e.g. $R_{52} > R_{42}$, etc). If it is desired that the circuit of FIG. 3a has the transfer characteristic of curve 1, then the W/L ratio for $T_1$ and $T_2$ would be $R_{11}$ and $R_{12}$, respectively. The feedback arrangement of $T_1$ and $T_2$ in FIG. 3a has the flexibility of using any desired combination of transfer curves in FIG. 3b. For example, curve 1 in quadrant 2 corresponding to $R_{11}$ for $T_1$, may be used with curve 5 in quadrant 4 corresponding to $R_{52}$ of $T_2$, and so on. The transfer characteristic curves of FIG. 3b have an abscissa unit of volts and an ordinant unit of milliamps.

The advantages of the active shunt CMOS amplifier are that large NAND and NOR DOT functions are possible due to the capability of the shunt stage to render the capacitance of the source unobservable and to the fact that NAND and NOR device sizes are much smaller, reducing input loading and conserving chip area. In addition, for memory applications, bit line sensing goes faster since the capacitance of the source is relatively unobservable due to the presence of the shunt stage. The use of active FET devices in the feedback path instead of resistors keeps the device processing simple and improves circuit operation due to the device tracking. The non-linear voltage-current characteristics of the active feedback transistors 16 and 18 permit the tracking of the varying FET device gains in the logic to minimize undesirable variations in amplifier output voltage due to the non-uniform device gains. This tracking effect can be explained as follows. The output terminal 7 of the amplifier has a signal voltage $V = jR$. Current signal $j$ is proportional to the gain $T_L$ of the FET logic devices $A_1$, $B_1$ etc. If FET devices are used for R as in FIG. 3a, R is proportional to the reciprocal of its device gain $Y_R$. Thus $V = jR$ is proportional to $Y_L/Y_R$. If $Y_R$ and $Y_L$ are either small or matched, this ratio remains relatively constant, causing V to remain independent of overall gain variations.

Figure 4B:
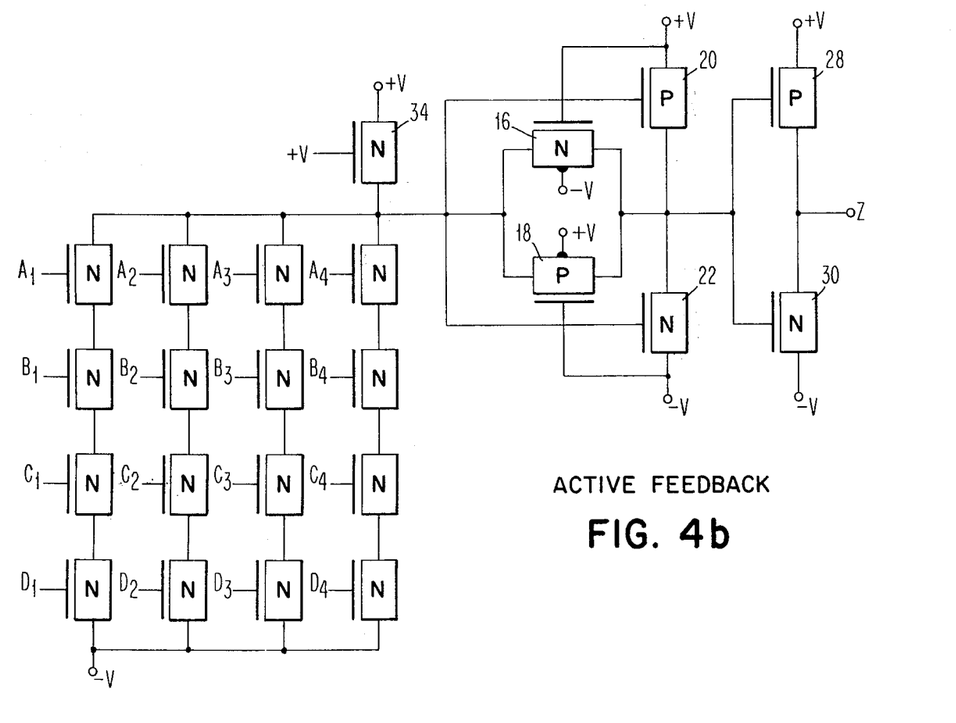
FIG. 4b is a detailed circuit diagram of the four-way DOT-OR of four-input ANDs employing the active shunt CMOS amplifier.
Figure 4C:
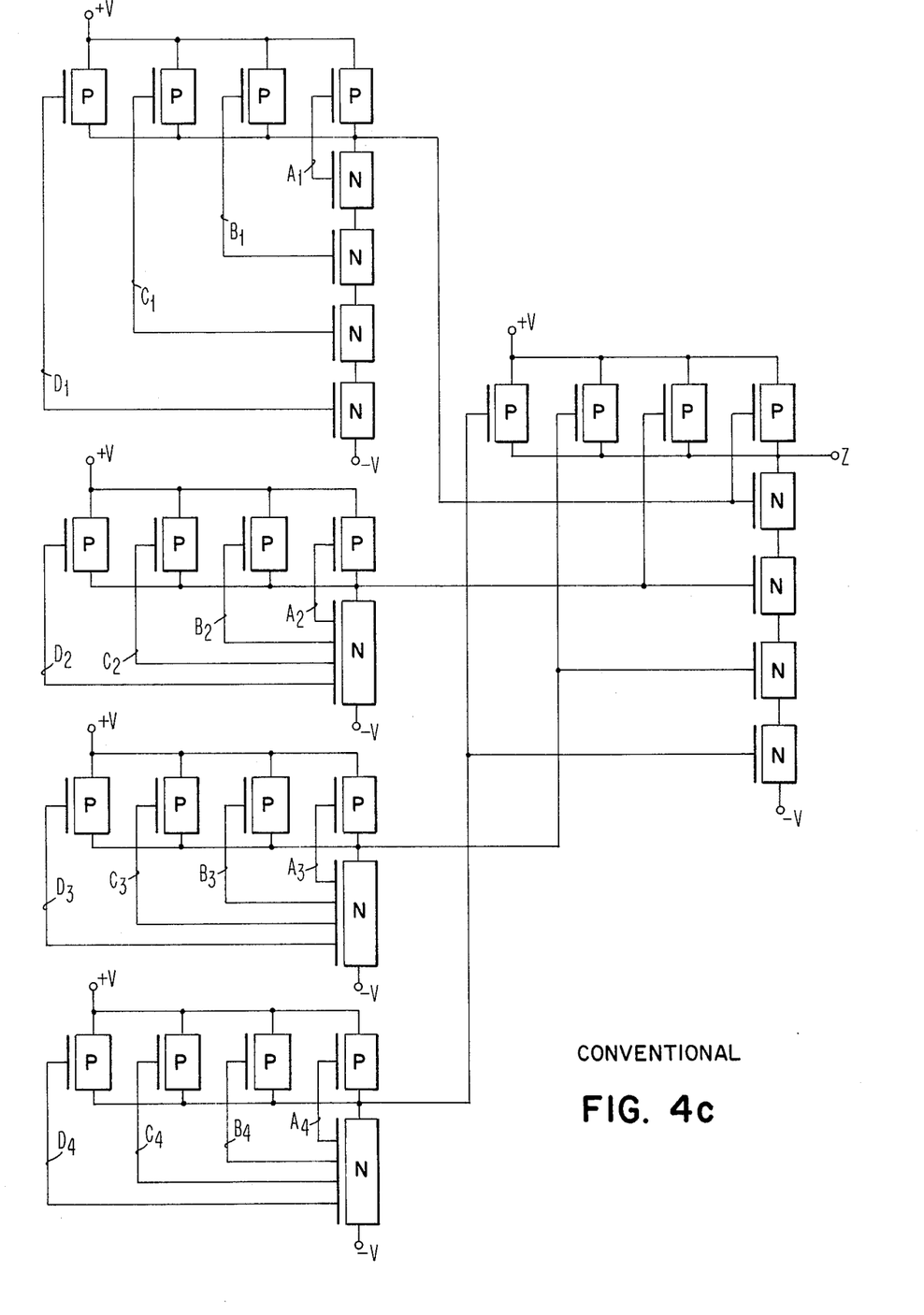
FIG. 4c is a detailed circuit diagram of the conventional CMOS circuit to accomplish the four-way DOT-OR of four-input ANDs.

FIG. 4b illustrates the utilization of the active shunt CMOS amplifier in the four-way DOT-OR of four-input ANDs similar to that shown in FIG. 4a. Any current source can be substituted for FET 34.

Figure 5A:
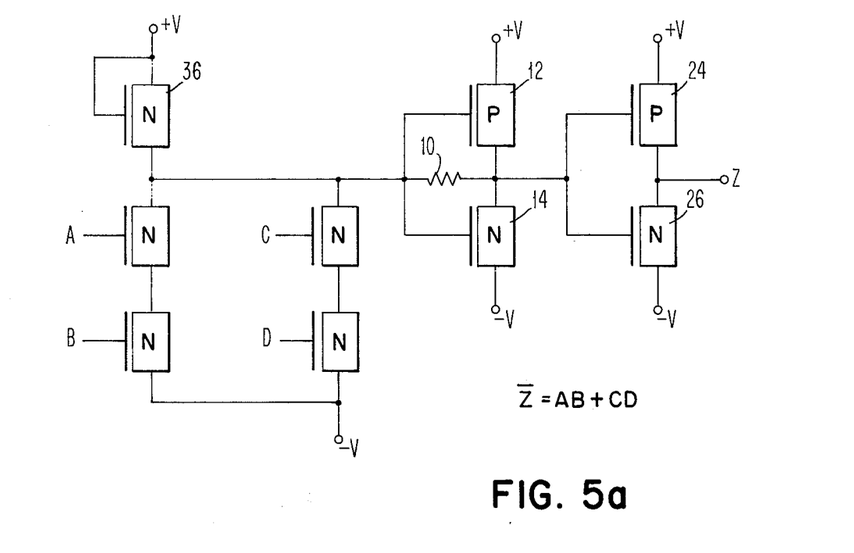
FIG. 5a illustrates the device organization to generate a complement function employing the resistor shunt CMOS amplifier.
Figure 6A:
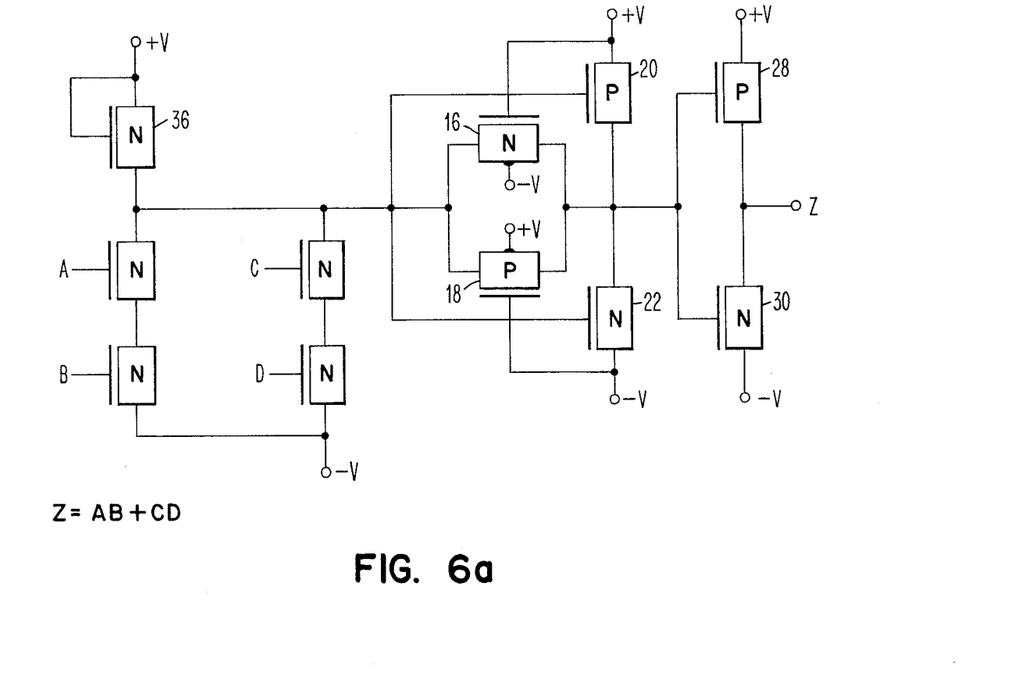
FIG. 6a illustrates the device organization to generate the complement function employing the active shunt CMOS amplifier.

The utilization of the resistor shunt CMOS amplifier and the active shunt CMOS amplifier in inverse shunt logic will now be described. The phase of any function generated by shunt logic can be determined by the device organization. If the constant current source 36 in FIG. 5a is a N-channel FET device is connected to the positive supply voltage +V, that is the logic current source is from the negative supply, the complement form of the function is generated, that is, $\overline{Z} = AB+CD$ as shown in FIG. 5a for the implementation with the resistor shunt CMOS amplifier and as shown in FIG. 6a for the implementation with the active shunt CMOS amplifier any current source can be substituted for FET 36.

Figure 5B:
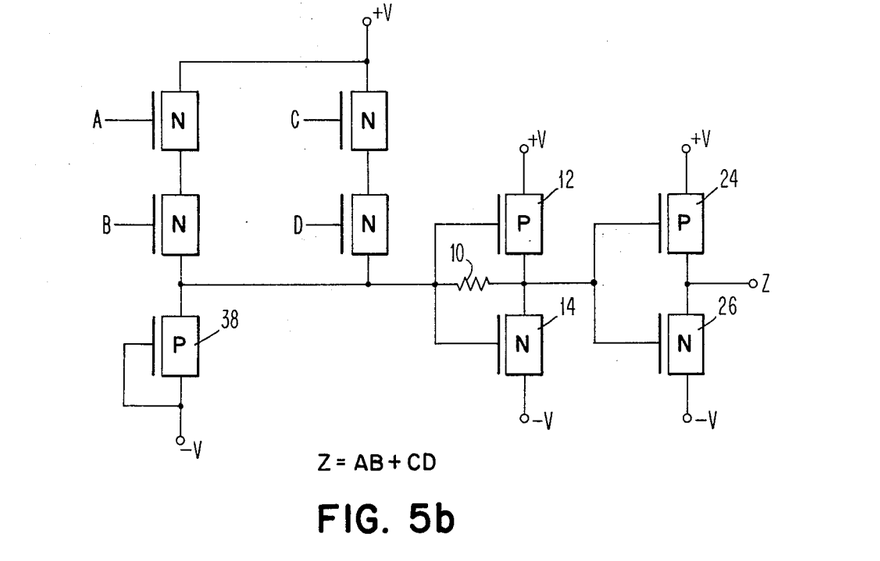
FIG. 5b illustrates the device organization to generate the true function employing the resistor shunt CMOS amplifier.
Figure 6B:
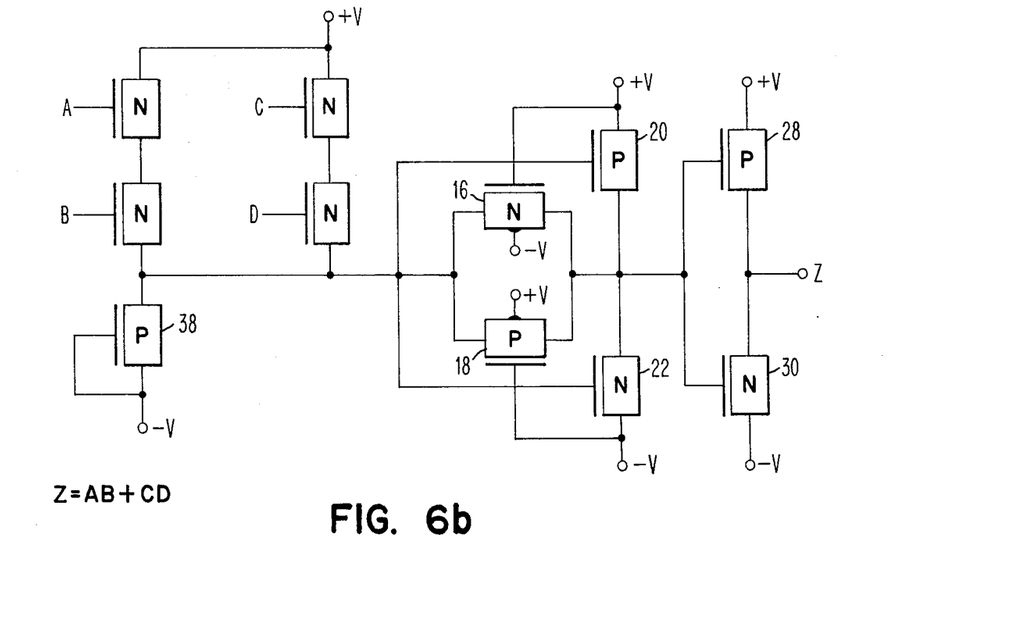
FIG. 6b illustrates the device organization to generate the true function employing the active shunt CMOS amplifier.

If the constant current source 38 which is a P-channel FET device in FIG. 5b and FIG. 6b, is connected to the negative supply −V, that is, the logic current source is from the positive supply +V, the TRUE form of the function is generated, that is, $Z = AB+CD$. This is shown in FIG. 5b for the implementation with the resistor shunt CMOS amplifier and as shown in FIG. 6b for the implementation with the active shunt CMOS amplifier. Any current source can be substituted for FET 38.

The advantage here is that the true or complement of any function can be generated without the need for an inverter stage which both delays the function and requires more circuits. Stated differently, device organization allows shunt logic to be either AOI logic, that is AND/OR INVERTS or AO logic that is AND-OR, with the identical number of devices and with the equivalent delay. The large output node capacitance of the AOI or AO logic circuit is circumvented by the resistor shunt or active shunt CMOS amplifier, enabling the performance of the logic function at a high speed.

The utilization of the resistor shunt CMOS amplifier and the active shunt CMOS amplifier in shunt complex logic will now be described. Complex logic is a combination of classical digital logic and relay logic. The utilization of complex logic allows a further minimization in the number of FET devices necessary to generate a particular logic function. A reduction in the number of devices allows for a reduction in the necessary wiring and reduction of the loading on previous stages.

Figure 7A:
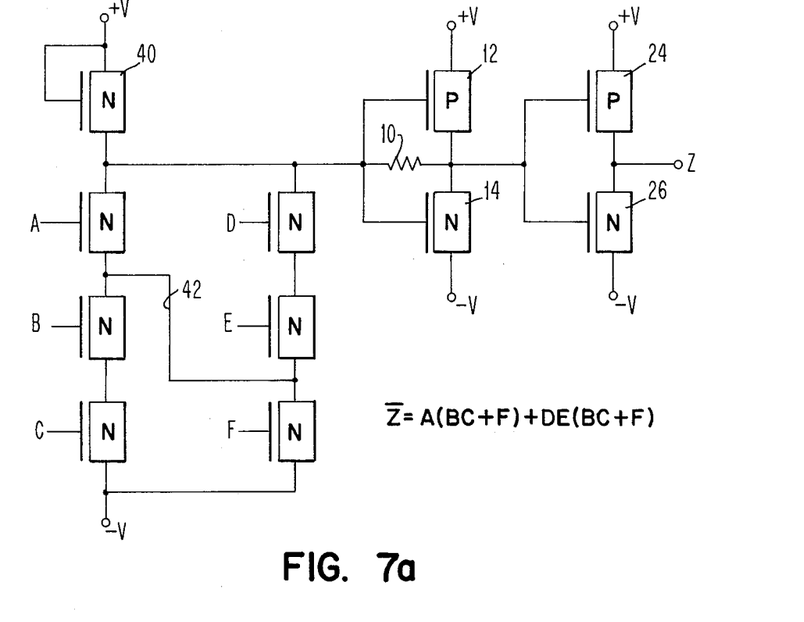
FIG. 7a illustrates the implementation of a complex logic function employing the resistor shunt CMOS amplifier.
Figure 7B:
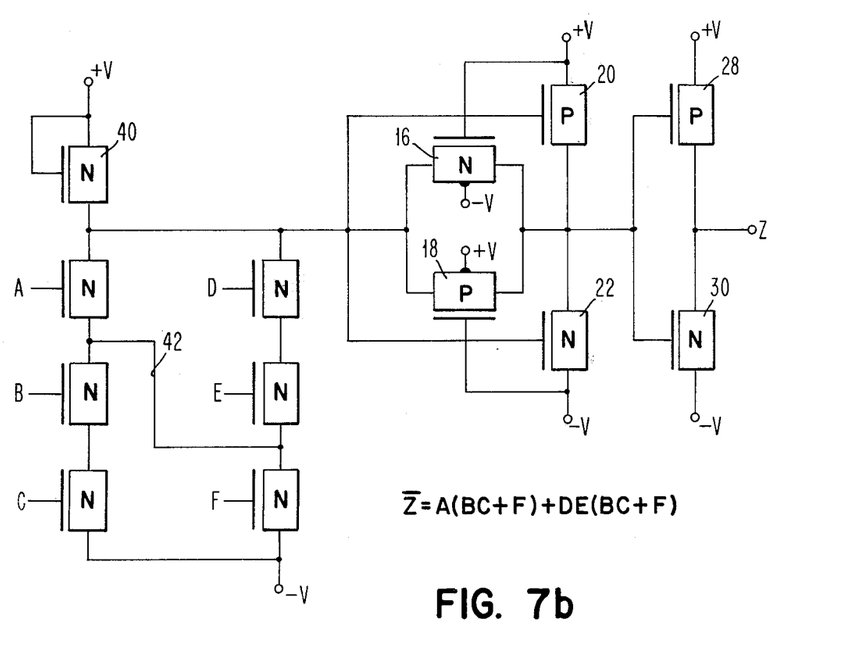
FIG. 7b illustrates the implementation of a complex logic function employing the active shunt CMOS amplifier.

FIG. 7a illustrates the utilization of the resister shunt CMOS amplifier in a complex logic circuit and FIG. 7b illustrates the utilization of the active shunt CMOS amplifier in the implementation of the same logic circuit. FIG. 7a shows that by adding the wire 42 to the logic form $\overline{Z} = ABC + DEF$, the logic function becomes a complex logic form with the expression $\overline{Z} = A(BC + F) + DE(BC + F)$. The wire 42 provides the OR function for the major term $A(BC+F)$ and the minor term $DE(BC+F)$. This implementation of complex logic in FIG. 7a is faster and requires fewer devices than was necessary in the prior art. This shunt complex logic circuit provides a means to implement complex digital functions with a minimum device usage and at the same time provide the same function with the maximum speed. The large output node capacitance of the complex logic circuit is circumvented by the resistor shunt or the active shunt CMOS amplifier, enabling the performance of the logic function at a high speed.

Here follows a description of the utilization of resistor shunt CMOS amplifier and the active shunt CMOS amplifier in shunt logic with independent input phasing. The polarity of the devices used in shunt logic determines the phase significance of the input signals. Stated otherwise, n-type devices reflect the true significance of input signals while p-type devices reflect the complement significance to input signals. Thus, if an expression or function implemented in shunt logic requires the complement of a signal generated in a previous stage, the complement signal may be realized by designating a p-type device for the input signal, instead of requiring a stage of inversion which also adds delay in signal propagation.

Figure 8A:
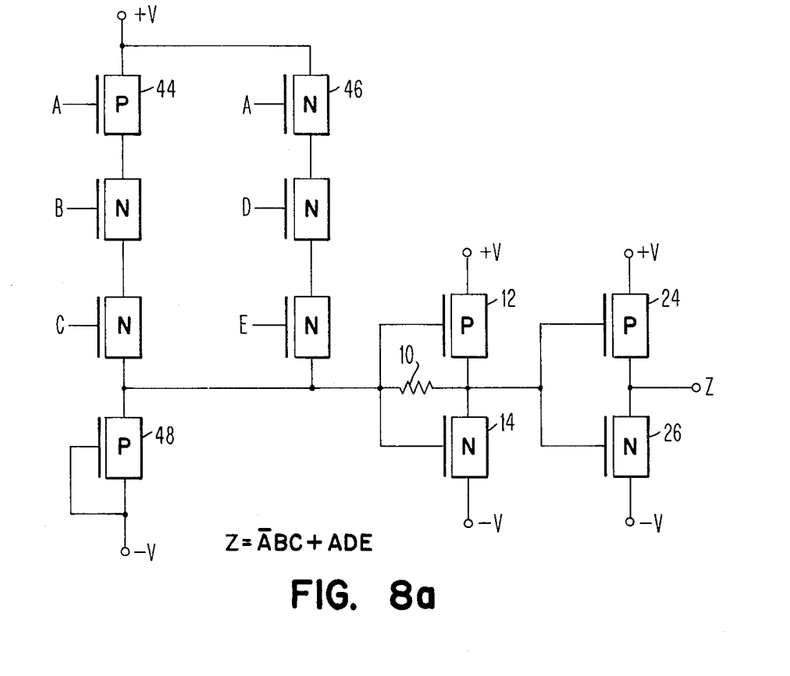
FIG. 8a illustrates the implementation of a logic function with both polarity devices employing the resistor shunt CMOS amplifier.
Figure 8B:
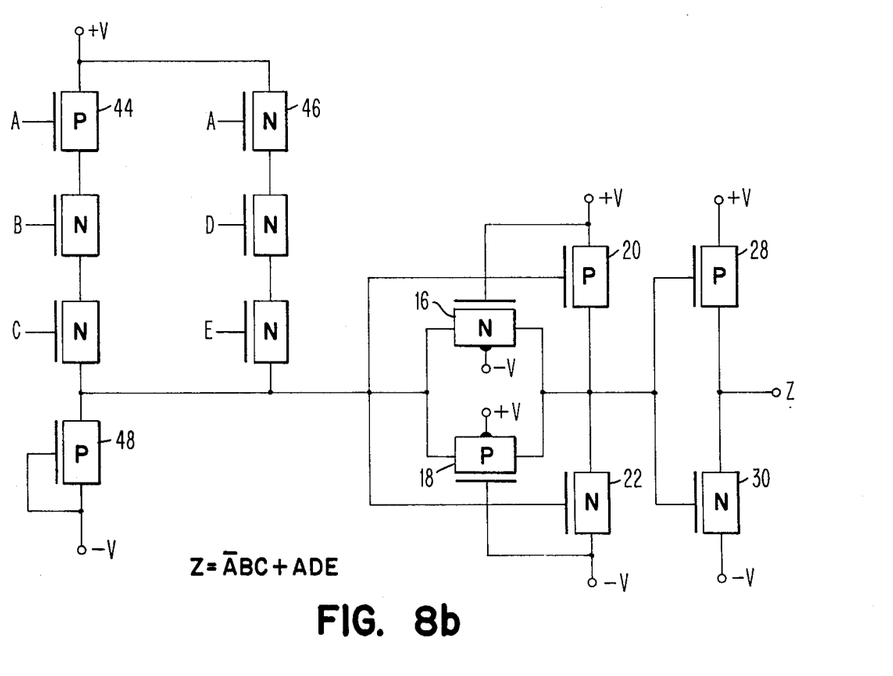
FIG. 8b illustrates the implementation of a logic function with both polarity devices employing the active shunt CMOS amplifier.

Another advantage of this technique occurs when both the true and complement of an input signal are required to implement an expression or function in shunt logic. For example, FIG. 8a shows the implementation for the expression $Z = \overline{A}BC + ADE$ is a resistor shunt CMOS amplifier and FIG. 8b shows the implementation of the expression using the active shunt CMOS amplifier. Notice that there need be only one wire from the signal line $A$ to the circuit with the true value of A being implemented by the N-channel FET 46 and the complement value of the signal $A$ being implemented by the P-channel FET 44, thereby reducing the necessary wiring. Notice also that the transition of $A$ simultaneously effects the expressions $\overline{A}BC$ and $ADE$ whereas if the complement value $\overline{A}$ was generated by an inverter stage from the input signal source of $A$, the $\overline{A}$ signal will lag the $A$ signal by the delay of the inverter and any transition of $A$ may result in an erroneous value for the resultant function Z during that period of the lag.

Figure 9A:
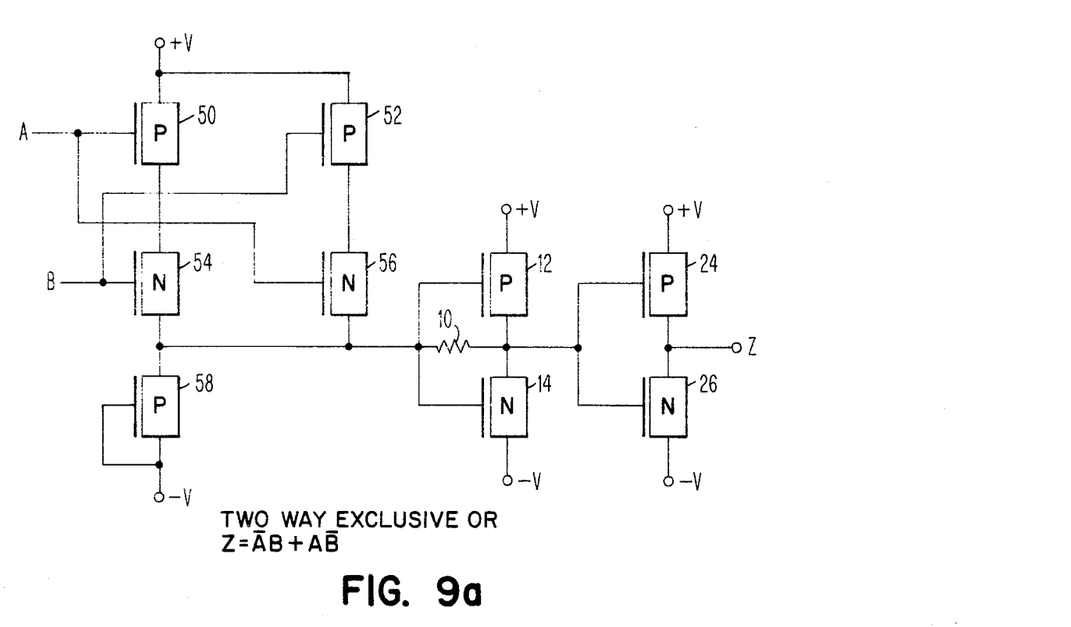
FIG. 9a illustrates the implementation of a two-way exclusive OR employing the resistor shunt CMOS amplifier.
Figure 9B:
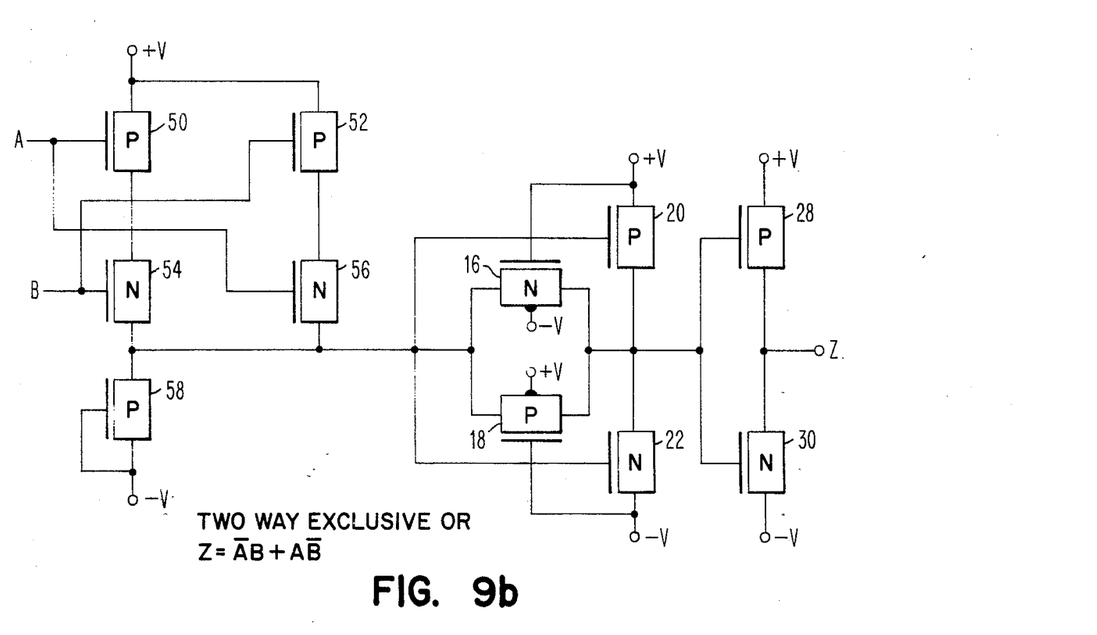
FIG. 9b illustrates the implementation of a two-way exclusive OR employing the active shunt CMOS amplifier.

A two-way exclusive OR circuit utilizing the transistor shunt CMOS amplifier and the active shunt CMOS amplifier as shown in FIGS. 9a and 9b, respectively, will now be described. FIGS. 9a and 9b shown a two-way exclusive OR requiring only two wires A and B to input the $A$ and $B$ inputs with no added delay to generate the $\overline{A}$ and the $\overline{B}$ complementary signals.

Figure 10:
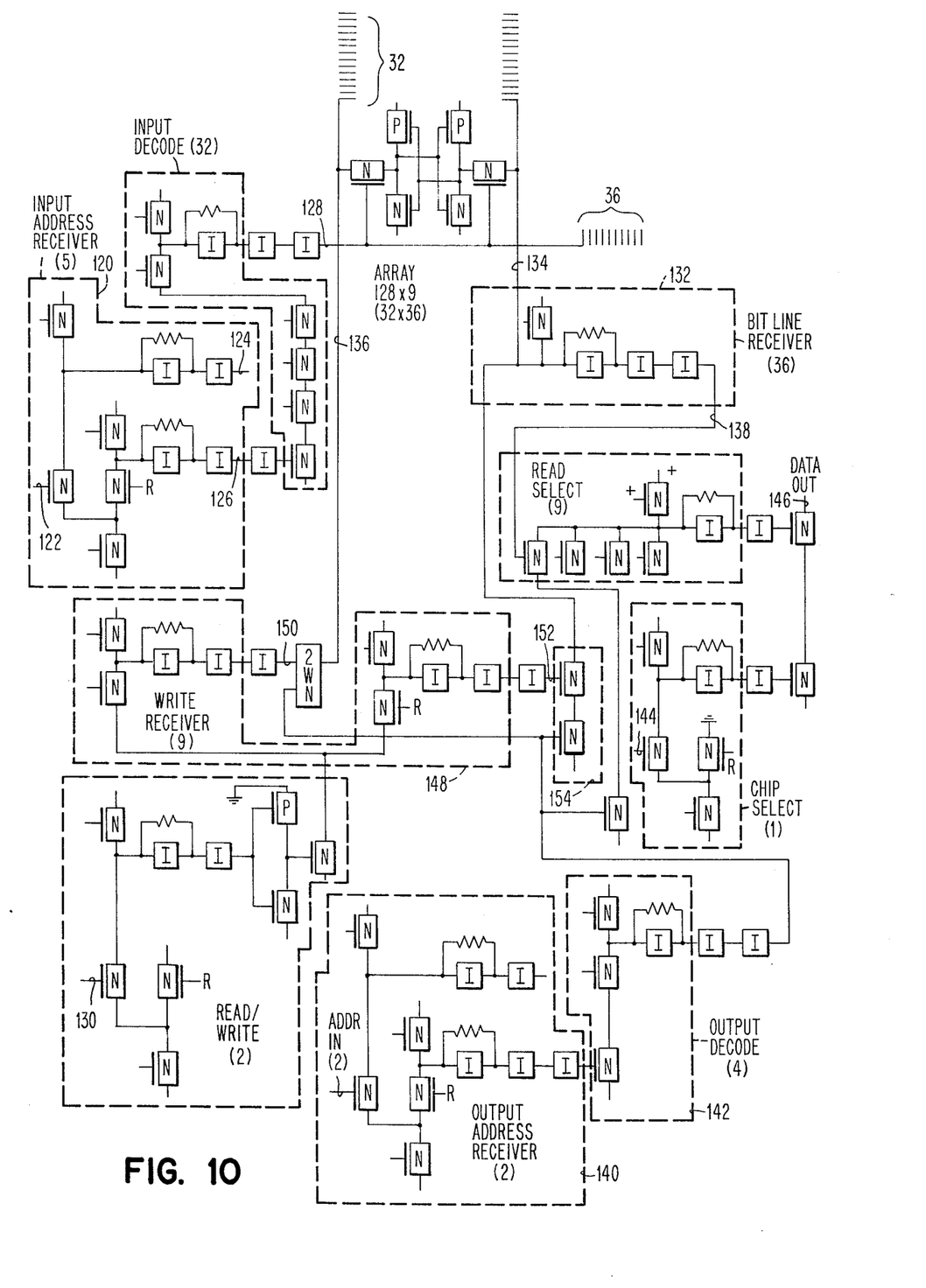
FIG. 10 illustrates the implementation of a random access memory array which employs either the resistor shunt CMOS amplifier or the active shunt CMOS amplifier.
Figure 12:
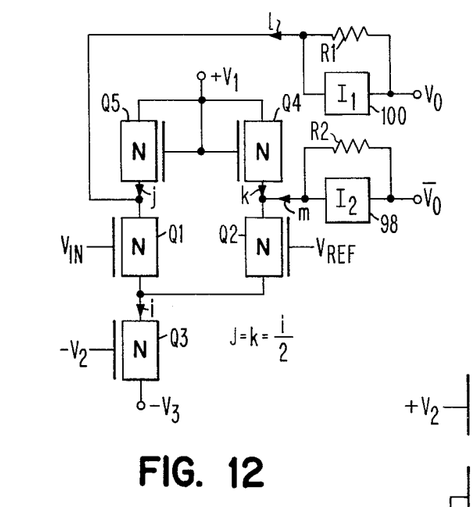
FIG. 12 illustrates a first embodiment of a fast MOS interchip receiver employing either the resistor shunt CMOS amplifier or the active shunt CMOS amplifier.

FIG. 10 illustrates the utilization of either the resistor shunt CMOS amplifier or the active shunt CMOS amplifier as the amplifying element in the bit line receiver 132, logic 142, and interconnection receiver 120, among others in the random access memory array shown in FIG. 10. The memory is arranged in 128 9-bit words, 4 of which are accessed simultaneously: input ADR receivers 120 (as shown in FIG. 12) converts input address lines 122 to true and complement lines 124 and 126 which decode one of 32 word lines 128. Assuming that the read/write line 130 is in read mode, 36 shunt bit line receivers 132 sense the presence of a word-line-selected current in bit line 134. The 36 outputs are then further decoded to 9 of 36 by two output address receivers 141 and output decode 142. A chip select line 144 allows dotting among outputs 146. In write mode, the write receiver 148 is enabled and true and complement lines 150 and 152 drive the nine of 36 bit line pairs 136 and 134 respectively, selected by the output decode 142. The bit-line receiver 132 is overdriven by the write driver 154 when the bit line 134 is written. The interconnection receivers (RCV) are shown in detail in FIG. 12. The logic circuits (LOG) are illustrated by the example of FIGS. 4a or 4b. The bit-line receiver 132 is shown in detail in FIGS. 2 or 3a. The shunt amplifier bit-line receiver 154 can perform the rapid extraction of a relatively small signal current output on bit line 134 from one of the memory elements in the array, which appears in parallel with a large source capacitance imposed by the bit line and other elements of the memory.

Figure 11A:
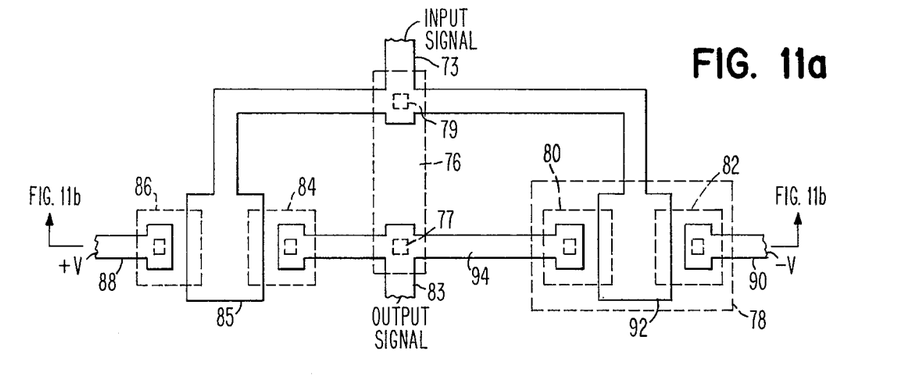
FIG. 11a is a plan view of the semiconductor structure for the resistor shunt CMOS amplifier.
Figure 11B:
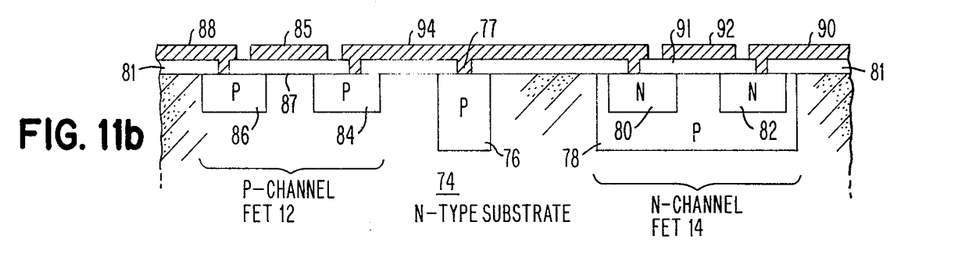
FIG. 11b is a cross sectional view of the semiconductor structure for the resistor shunt CMOS amplifier, along the line A-A'.

FIGS. 11a and 11b illustrate the structural implementation of the resistor shunt CMOS amplifier. Into the substrate 74 is diffused the p-type resistor 76, the p-type pocket 78, and the p-type source and drain 84 and 86 for what will eventually be the P-channel FET device 12. Subsequently, the n-type source and drain regions 80 and 82 are diffused into the p-type pocket 78 so as to form the N-channel FET device. After suitable gate insulators are grown for the P-channel FET device 12 and the N-channel FET device 14, the gate metallizations 85 and 92 are deposited along with the interconnection metallization 88, 90 and 94. A cross sectional view along the axis A-A' is shown in FIG. 11b. The metallization 88 is connected to the upper voltage +V and is connected through a via hole to the p-type diffusion 86 which serves as the source for the P-channel FET 12. The p-type diffusion 84 serving as the drain for the P-channel FET 12 is connected by a via hole to the metallization 94. Metallization 94 is connected by a via hole to the n-type diffusion 80 which serves as the drain for the N-channel FET device 14. The n-type diffusion 82 which serves as the source for the N-channel FET device 14 is connected by a via hole to the metallization 90 which is, in turn, connected to the lower voltage −V. Metallization 94 is connected to metallization 83 which serves as the output signal node for the resistor shunt CMOS amplifier. A metallization 94 is connected by means of the via hole 77 to the diffused resistor 76 which is approximately 2.6 kiliohms per square. The diffused resistor 76, which serves as the resistor 10 shown in FIG. 2 has its opposite end connected by means of the via hole 79 to the input signal metallization 73. The input signal metallization 73 is connected to the gate electrode 85 for the P-channel FET 12 and the gate electrode 92 for the N-channel FET 14.

Figure 13:
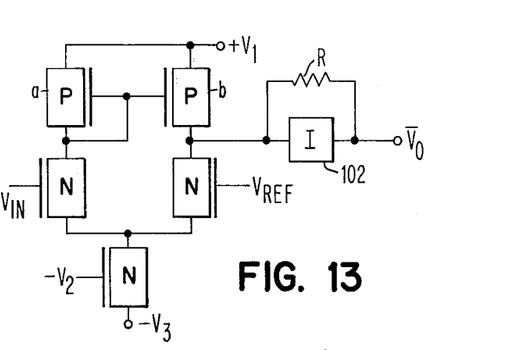
FIG. 13 illustrates a second embodiment of the fast MOS interchip receiver employing either the resistor shunt CMOS amplifier or the active shunt CMOS amplifier.
Figure 14:
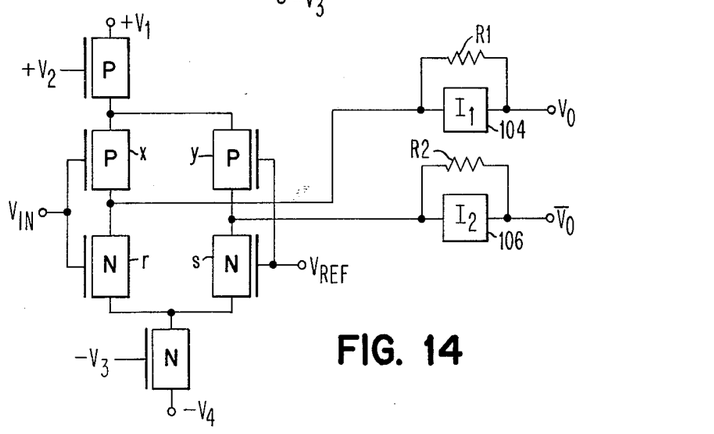
FIG. 14 illustrates a third embodiment of the fast MOS interchip receiver employing either the resistor shunt CMOS amplifier or the active shunt CMOS amplifier.

There follows a discussion of three embodiments of a fast MOS interchip receiver shown in FIGS. 12, 13 and 14 employing the resistor shunt CMOS amplifier or the active shunt CMOS amplifier. The circuit shown in FIGS. 12, 13 and 14 solves the speed/power problem of MOS interconnection.

Signal lines are normally terminated to eliminate reflections and to minimize speed. The small transmission line impedances resulting from high density packaging (Z. < 0.1 Kohms) require small signal voltage swings (Vi) in order to minimize power. (Total interconnection power equals the series current Vi/Zo multiplied by the total voltage difference across the driver device and terminating resistor.)

Signal size must, however, exceed the sum of noise and input threshold uncertainty.

Small signal voltages dictate higher receiver gains for the same receiver output swing and transition time. Higher gain is most easily achieved with larger devices having inherently larger capacitances, a fact which tends to reduce speed. At best, a compromise between maximum speed and minimum power is made with the prior art. The disclosed receiver simultaneously minimizes threshold uncertainty and reduces the effect of device capacitance, thus allowing small input voltage swings, low power and high speed. The basic implementation of the fast MOS interchip receiver is shown in FIG. 12. $V_1$, $V_2$, $V_3$ and $V_{REF}$ are supply voltages. Devices Q1 and Q2 form a differential amplifier with Q3, Q4 and Q5 acting as current sources. The inverter I1 and the resistor R1 form the shunt feedback stage 100 as do the inverter I2 and resistor R2 form stage 98. Each inverter resistor pair can be embodied as the resistor shunt CMOS amplifier of FIG. 2 or the active shunt CMOS amplifier of FIG. 3a. The gate of Q1 may, for example, be connected by means of a printed circuit transmission line to an off-chip signal source, with a termination impedance of Zo at the gate of Q1. If the input $V_{IN}$ is greater than $V_{REF}$, Q1 turns on and Q2 turns off. The current i flows in the drain of Q1 and the current 1 where $1 = i-j$, enters the shunt stage 100 causing $V_0$ to be at an up level. Simultaneously, the current m, where m is equal to $-K$, causes $\overline{V}_0$ to be at a down level. If $V_{IN}$ is less than $V_{REF}$, Q1 turns off and Q2 turns on, and the outputs switch to the complementary stages.

Because of the ability of the shunt feedback amplifier stages 98 and 100 to rapidly extract a relatively small signal current from an output node in parallel with a large capacitance, the effect of the device capacitances of Q1, Q2, Q4 and Q5 is minimal and therefore the devices can be made as large as is required for proper gain without affecting the speed of the circuit. The size of the input voltage swing is then limited only by the noise margin and input offset $V_{GS1} - V_{GS2}$.

It is, of course, apparent that Q3, Q4 and Q5 of FIG. 12 could be replaced by any current source. Also Q1 and Q2 could be P-channel instead of N-channel with appropriate changes in current source polarities.

Two alternative implementations of the fast MOS interchip receiver are shown in FIG. 13 and FIG. 14. Both circuits provide higher gain than that shown in FIG. 12 while eliminating the tracking requirement for the current sources where $J=K=I/2$. FIG. 13 utilizes a current mirror embodied as devices A and B, with $V_1 > V_{REF} > (-V_3)$ and $(-V_2) > (-V_3)$ and FIG. 14 utilizes a complementary differential amplifier embodied in devices R and S and X and Y so as to obtain the higher gains, with $V_1 > V_{REF} > (-V_4)$ and $V_1 > V_2$ and $(-V_3) > -V_4$). The advantages of the fast MOS interchip receiver include low delta I (allowing more simultaneous switching), low power consumption and higher speed. The receiver is only minimally affected by input voltage swings or device size. Because of the expected higher sensitivity of NFET threshold voltage $V_{TH}$ to the source to the substrate voltage $V_{SX}$, the input devices Q1 and Q2 should be isolated so that their substrates may be tied to the common source $V_{SX}=0$. This may cause a small increase in capacitance at this node.

While the invention has been particularly shown and described with reference to the preferred embodiments thereof, it will be understood by those skilled in the art that the foregoing and other changes in form and details may be made therein without departing from the spirit and the scope of the invention.

We claim:

1. A high performance digital circuit, comprising: an FET digital subcircuit having a plurality of input signal terminals and a subcircuit output signal node characterized by a large source capacitance;
   a negative feedback amplifier in shunt feedback configuration having its input terminal connected to said subcircuit output signal node for providing a low impedance path for current around said capacitance and having an amplifier output terminal;
   said feedback amplifier comprising:
   a first P-channel FET device having a source connected to a relatively high supply voltage and a drain connected to said amplifier output terminal and to the drain of a first N-channel FET device having its source connected to a relatively low supply voltage;
   said first P-channel FET device having a gate electrode connected to said amplifier input terminal and said first N-channel FET device having a gate electrode connected to said amplifier input terminal;
   a resistor connected between said amplifier input and output terminals;
   whereby said digital subcircuit with high output capacitance can be operated at a high speed.

2. The high performance digital circuit of claim 1, wherein said FET digital subcircuit comprises:
   a current source connected between a relatively high supply voltage and said subcircuit output signal node;
   a plurality of N-channel FET devices connected between said subcircuit output signal node and a relatively lower supply voltage in a logic function organization with their respective gate electrodes connected to logic signal inputs;
   whereby the complement form of said logic function is implemented in a high speed circuit.

3. The high performance digital circuit of claim 1, wherein said FET digital subcircuit comprises:

a current source connected between a relatively low supply voltage and said subcircuit output signal node;

a plurality of N-channel FET devices connected between said subcircuit output signal node and a relatively high supply voltage in a logic function organization with their respective gate electrodes connected to logic signal inputs;

whereby the true form of said logic function is implemented in a high speed logic circuit.

4. The high performance digital circuit of claim 1, wherein said FET digital subcircuit comprises:

a current source connected between a relatively high supply voltage and said subcircuit output signal node;

a first device group containing at least one N-channel FET device having its source connected to a relatively lower supply voltage and its drain connected to said subcircuit output signal node and its gate connected to a first logic input signal source;

a second device group containing at least one N-channel FET device having its source connected to said relatively lower supply voltage and its drain connected to said subcircuit output signal node and its gate connected to a second logic input signal source;

said first and second device groups being connected in parallel between said relatively lower supply voltage and said subcircuit output signal node;

whereby a high speed DOT-OR logic circuit is formed.

5. The high performance digital circuit of claim 4, wherein said digital subcircuit further comprises:

said first device group containing a plurality of N-channel FET devices connected in series between said relatively lower supply voltage and said subcircuit output signal node with their gates connected to a first group of logic input signals;

said second device group containing a plurality of N-channel FET devices connected in series between said relatively lower supply voltage and said subcircuit output signal node with their gates connected to a second group of logic input signals;

whereby a high speed DOT-OR of ANDs logic circuit is formed.

6. The high performance digital circuit of claim 1, wherein said FET digital subcircuit comprises:

a current source connected between a relatively high supply voltage and said subcircuit output signal node;

a first device group containing a first and a second N-channel FET devices connected in series between a relatively low supply voltage and said subcircuit outpput signal node with their gates connected to a first group of logic signal inputs, with the connection between said first and second N-channel FET devices forming a first logic node;

a second device group containing a third and a fourth N-channel FET devices connected in series between said relatively low supply voltage and said subcircuit output signal node with their gates connected to a second group of logic signal inputs, with the connection between said third and fourth N-channel FET devices forming a second logic node;

said first and second device groups being connected in parallel between said relatively low supply voltage and said subcircuit output signal node;

said first and second logic nodes being connected together;

whereby a high speed complex logic circuit is formed.

7. The high performance digital circuit of claim 1, wherein said FET digital subcircuit comprises:
complementary FET digital logic devices.

8. The high performance digital circuit of claim 7, wherein said complementary FET digital subcircuit comprises:

a current source connected between a relatively low supply voltage and said subcircuit output signal node;

an N-channel FET logic device connected between said subcircuit output signal node and a relatively high supply voltage, with its gate electrode connected to an input signal source;

a P-channel FET logic device connected between said subcircuit output signal node and said relatively high supply voltage, with its gate electrode connected to said input signal source;

whereby a true form of said input signal is generated by said N-channel FET logic device and a complement form of said input signal is generated by said P-channel FET logic device in a high speed logic circuit.

9. The high performance digital circuit of claim 7, wherein said complementary FET digital subcircuit comprises:

a current source connected between a relatively low supply voltage and said subcircuit output signal node;

a first P-channel FET device having its source connected to a relatively high supply voltage and its drain connected to the drain of a first N-channel FET device having its source connected to said subcircuit output signal node;

said first P-channel FET device having a gate electrode connected to a first logical input signal source and said first N-channel FET device having a gate electrode connected to a second logical input signal source;

a second P-channel FET device having its source connected to said relatively high supply voltage and its drain connected to the drain of a second N-channel FET device having its source connected to said subcircuit output signal node;

said second P-channel FET device having a gate electrode connected to said second logical input signal source and said second N-channel FET device having a gate electrode connected to said first logical input signal source;

whereby a two-way exclusive OR logic function is embodied in a high speed logic circuit.

10. A high performance digital circuit, comprising:

a FET digital subcircuit having a plurality of input signal terminals and a subcircuit output signal node characterized by a large source capacitance;

a negative feedback amplifier in shunt feedback configuration having its input terminal connected to said subcircuit output signal node for providing a low impedance path for current around said capacitance and having an amplifier output terminal;

said feedback amplifier comprising:

a first P-channel FET device having a source connected to a relatively high supply voltage and a drain connected to said amplifier output terminal and to the drain of a first N-channel FET device having its source connected to a relatively low supply voltage;

said first P-channel FET device having a gate electrode connected to said amplifier input terminal and said first N-channel FET device having a gate electrode connected to said amplifier input terminal;

a resistor connected between said amplifier input and output terminals;

an inverting amplifier including a pair of opposite conductivity field effect transistors connected in series between a relatively high and a relatively low supply voltage and having their gate electrodes connected to each other and to said amplifier output terminal, the junction between their series connection forming the output of said digital circuit;

whereby said digital subcircuit with high output capacitance can be operated at a high speed.

11. The high performance digital circuit of claim 10, wherein said FET digital subcircuit comprises:

a current source connected between a relatively high supply voltage and said subcircuit output signal node;

a plurality of N-channel FET devices connected between said subcircuit output signal node and a relatively low supply voltage in a logic function organization with their respective gate electrodes connected to logic signal input sources;

whereby the complement form of said logic function is implemented in a high speed logic circuit.

12. The high performance digital circuit of claim 10, wherein said FET digital subcircuit comprises:

a current source connected between a relatively low supply voltage and said subcircuit output signal node;

a plurality of N-channel FET devices connected between said subcircuit output signal node and a relatively high supply voltage in a logic function organization with their respective gate electrodes connected to logic signal input sources;

whereby the true form of said logic function is implemented in a high speed logic circuit.

13. The high performance digital circuit of claim 10, wherein said FET digital subcircuit comprises:

a current source connected between a relatively higher supply voltage and said subcircuit output signal node;

a first device group containing at least one N-channel FET device having its source connected to a relatively lower supply voltage and its drain connected to said subcircuit output signal node and its gate connected to a first logic input signal source;

a second device group containing at least one N-channel FET device having its source connected to said relatively low supply voltage and its drain connected to said subcircuit output signal node and its gate connected to a second logic input signal source;

said first and second device groups being connected in parallel between said relatively low supply voltage and said subcircuit output signal node;

whereby a high speed DOT-OR logic circuit is formed.

14. The high performance digital circuit of claim 13, wherein said digital subcircuit further comprises:

said first device group containing a plurality of N-channel FET devices connected in series between said relatively low supply voltage and said subcircuit output signal node with their gates connected to a first group of logic input signals;

said second device group containing a plurality of N-channel FET devices connected in series between said relatively low supply voltage and said subcircuit output signal node with their gates connected to a second group of logic input signals;

whereby a high speed DOT-OR of ANDs logic circuit is formed.

15. The high performance digital circuit of claim 10, wherein said FET digital subcircuit comprises:

a current source connected between a relatively high supply voltage and said subcircuit output signal node;

a first device group containing a first and a second N-channel FET devices connected in series between a relatively low supply voltage and said subcircuit output signal node with their gates connected to a first group of logic signal inputs, with the connection between said first and second FET devices forming a first logic node;

a second device group containing a thrid and a fourth N-channel FET devices connected in series between a relatively low supply voltage and said subcircuit output signal node with their gates connected to a second group of logic signal inputs, with the connection between said third and fourth FET devices forming a second logic node;

said first and second device groups being connected in parallel between said relatively low supply voltage and said subcircuit output signal node;

said first and second logic nodes being connected together;

whereby a high speed complex logic circuit is formed.

16. The high performance digital circuit of claim 10, wherein said FET digital subcircuit comprises:
complementary FET digital logic devices.

17. The high performance digital circuit of claim 16, wherein said complementary FET digital subcircuit comprises:

a current source connected between a relatively low supply voltage and said subcircuit output signal node;

an N-channel FET logic device connected between said subcircuit output signal node and a relatively higher supply voltage with its gate electrode connected to an input signal source;

a P-channel FET logic device connected between said subcircuit output signal node and said relatively high supply voltage, with its gate electrode connected to said input signal source;

whereby a true form of said input signal is generated by said N-channel FET logic device and a complement form of said input signal is generated by said P-channel FET logic device, in a high speed logic circuit.

18. The high performance digital circuit of claim 16, wherein said complementary FET digital subcircuit comprises:

a current source connected between a relatively low supply voltage and said subcircuit output signal node;

a first P-channel FET device having its source connected to a relatively high supply voltage and its drain connected to the drain of a first N-channel FET device having its source connected to said subcircuit output signal node;

said first P-channel FET device having a gate electrode connected to a first logical input signal source and said first N-channel FET device having a gate electrode connected to a second logical input signal source;

a second P-channel FET device having its source connected to said relatively high supply voltage and its drain connected to the drain of a second N-channel FET device having its source connected to said subcircuit output signal node;

said second P-channel FET device having a gate electrode connected to said second logical input signal source and said second N-channel FET device having a gate electrode connected to said first logical input signal source;

whereby a two-way exclusive OR logic function is embodied in a high speed logic circuit.

* * * * *